United States Patent [19]

Toro Lira et al.

[11] Patent Number: 4,604,020
[45] Date of Patent: Aug. 5, 1986

[54] INTEGRATED CIRCUIT WAFER HANDLING SYSTEM

[75] Inventors: Guillermo L. Toro Lira, Mountain View; Earl M. Jensen, San Jose, both of Calif.

[73] Assignee: Nanometrics Incorporated, Sunnyvale, Calif.

[21] Appl. No.: 593,287

[22] Filed: Mar. 26, 1984

[51] Int. Cl.$^4$ .............................................. B25J 3/00
[52] U.S. Cl. .................................. 414/217; 294/86.4; 269/156; 269/254 R; 104/165; 104/287; 250/440.1
[58] Field of Search ........................ 414/217; 198/619; 294/86.4; 269/153, 156, 254 R; 104/165, 281, 282, 287, 288, 290; 250/440.1, 441.1, 442.1

[56] References Cited

U.S. PATENT DOCUMENTS

| | | | |
|---|---|---|---|
| 654,134 | 7/1900 | Clark | 269/254 |
| 3,202,406 | 8/1965 | Tack | 198/619 X |
| 3,968,885 | 7/1976 | Hassan et al. | 414/217 X |
| 3,993,018 | 11/1976 | Kranik et al. | 250/440.1 X |
| 4,306,731 | 12/1981 | Shaw | 269/254 R X |
| 4,392,435 | 7/1983 | Moody et al. | 104/290 X |
| 4,465,416 | 8/1984 | Burkhalter et al. | 414/217 |
| 4,467,210 | 8/1984 | Sugihara et al. | 250/441.1 X |
| 4,503,807 | 3/1985 | Nakayama et al. | 414/217 X |

Primary Examiner—Robert J. Spar
Assistant Examiner—Ken Muncy
Attorney, Agent, or Firm—Linval B. Castle

[57] ABSTRACT

A system for transfering discs, such as integrated circuit wafers during manufacture, from a location at atmospheric pressure into a vacuum chamber of an electron microscope or the like with a minimum of vacuum loss to the chamber. A wafer is placed on a moveable holder in a small sealable chamber having a sealable top door and which is mounted to the outer surface of the vacuum chamber at the position of a small gate through the chamber wall. The wafer holder carries a magnet that is magnetically coupled to a second magnet outside of the sealable chamber and which is motor driven to transfer the wafer through the gate and into the vacuum chamber and upon a stage that has a three-point grasping mechanism operated by the leading end of the moving wafer holder. The wafer holder includes a solenoid operated clip that engages the leading edge of a wafer during pick-up of the wafer for its removal from the vacuum chamber. Because of the differences in volumes of the sealed exterior chamber and the vacuum chamber, the opening of the gate between them admits a very small amount of atmospheric pressure air and does not materially alter the vacuum pressure in the larger vacuum chamber.

3 Claims, 17 Drawing Figures

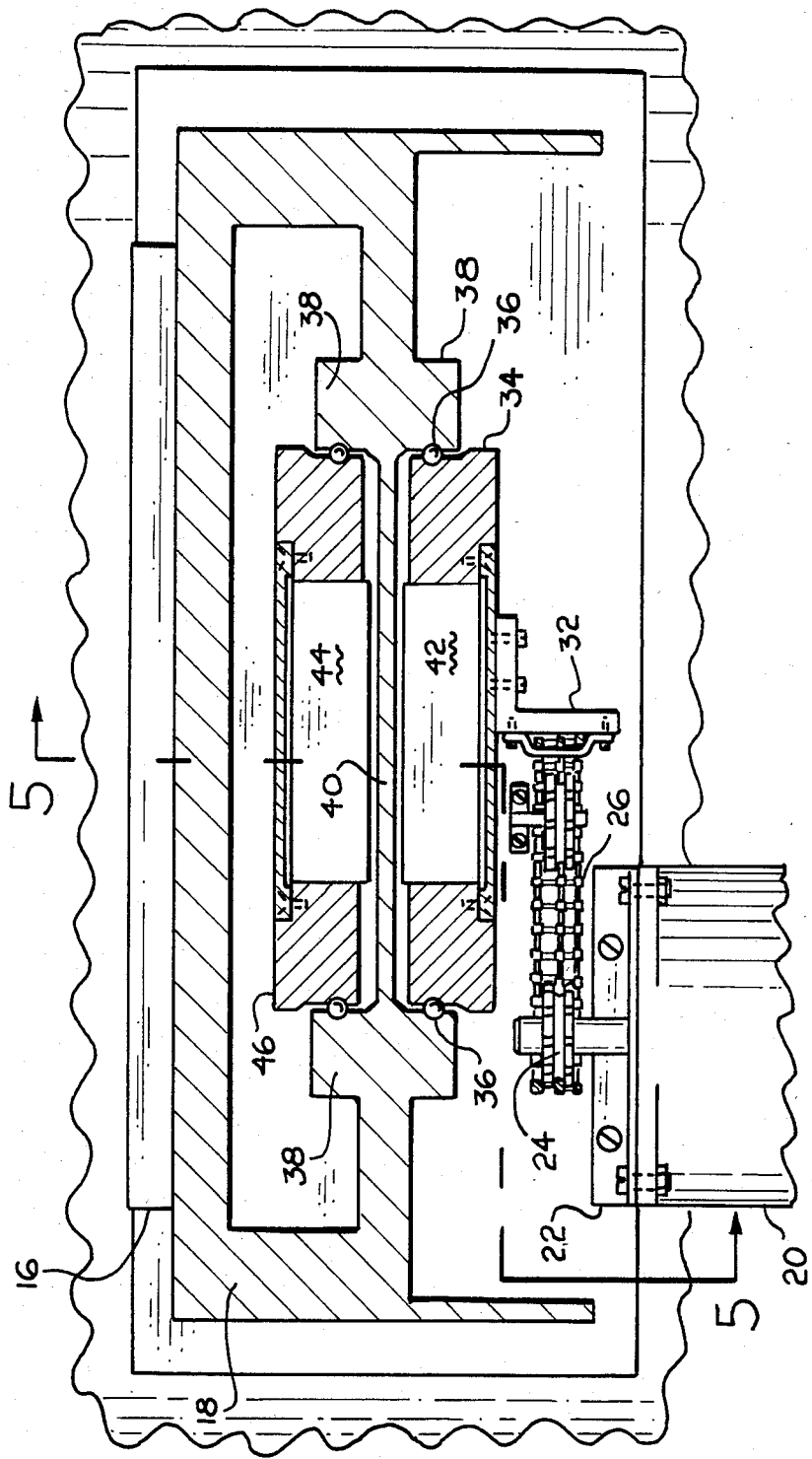

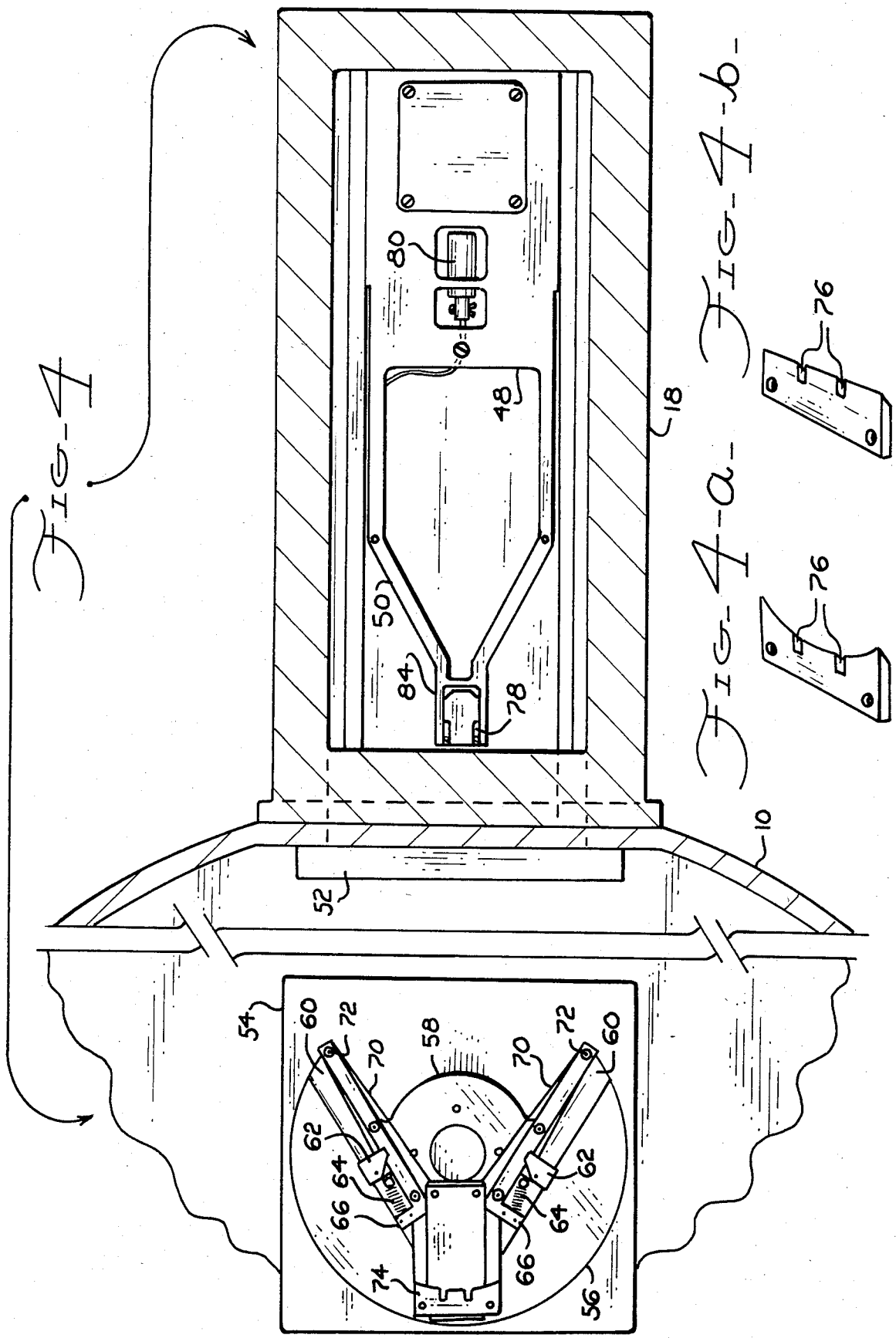

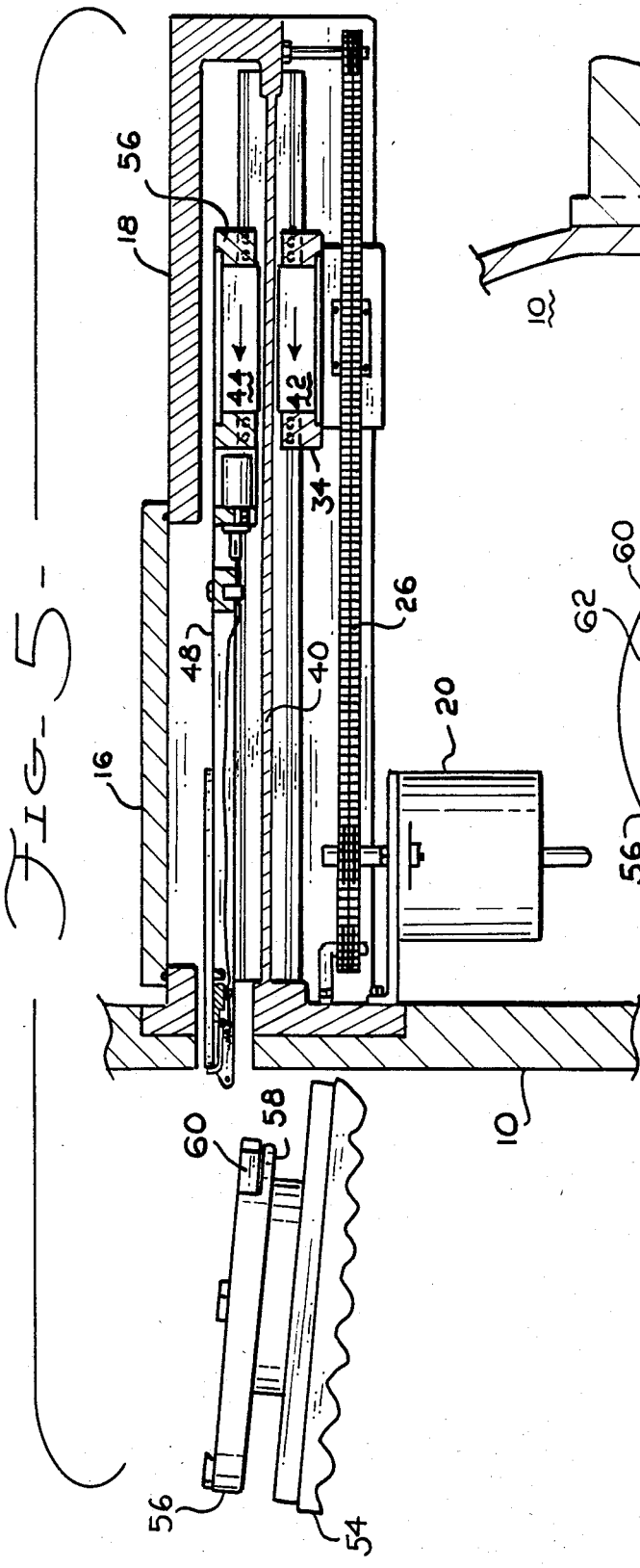

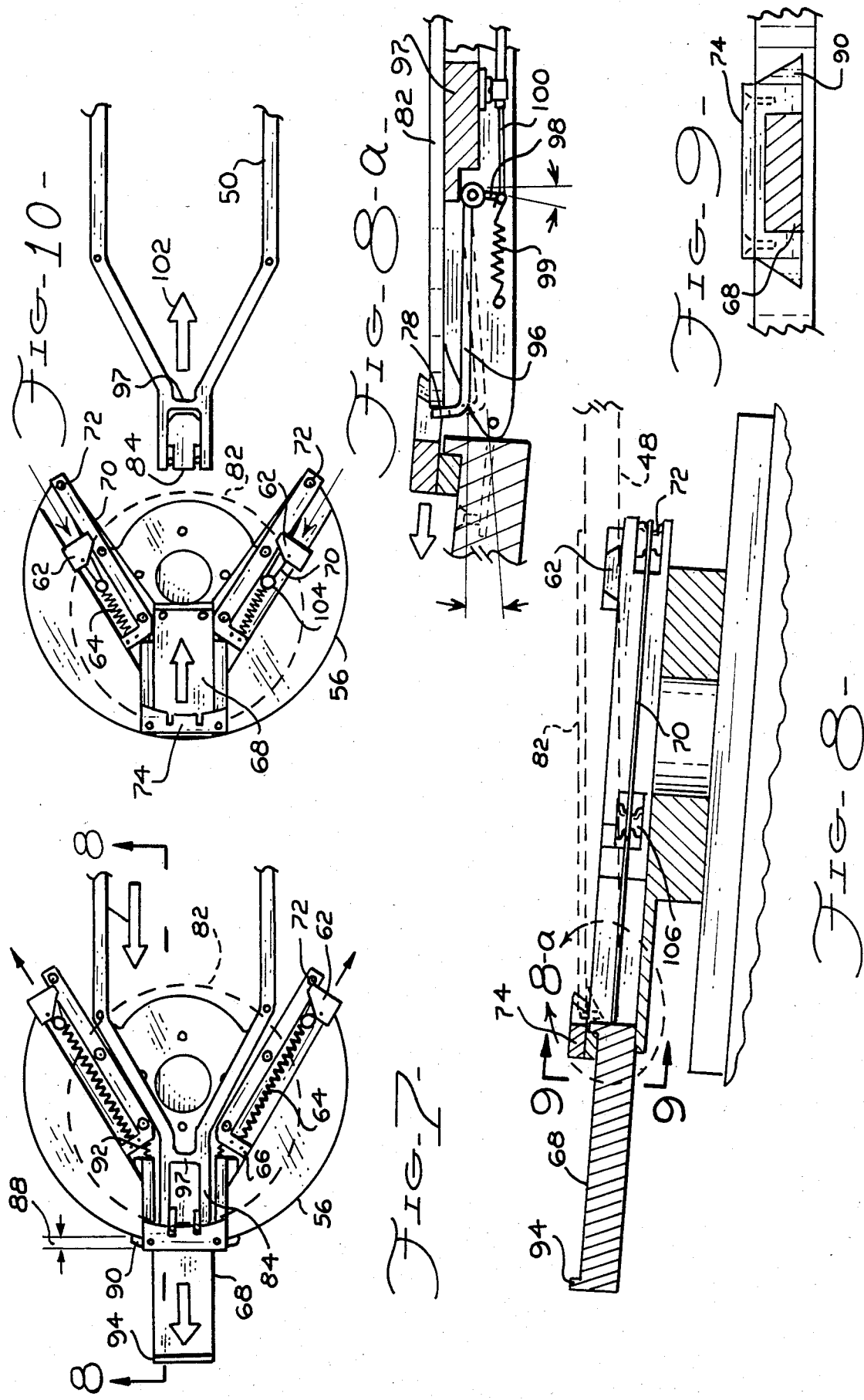

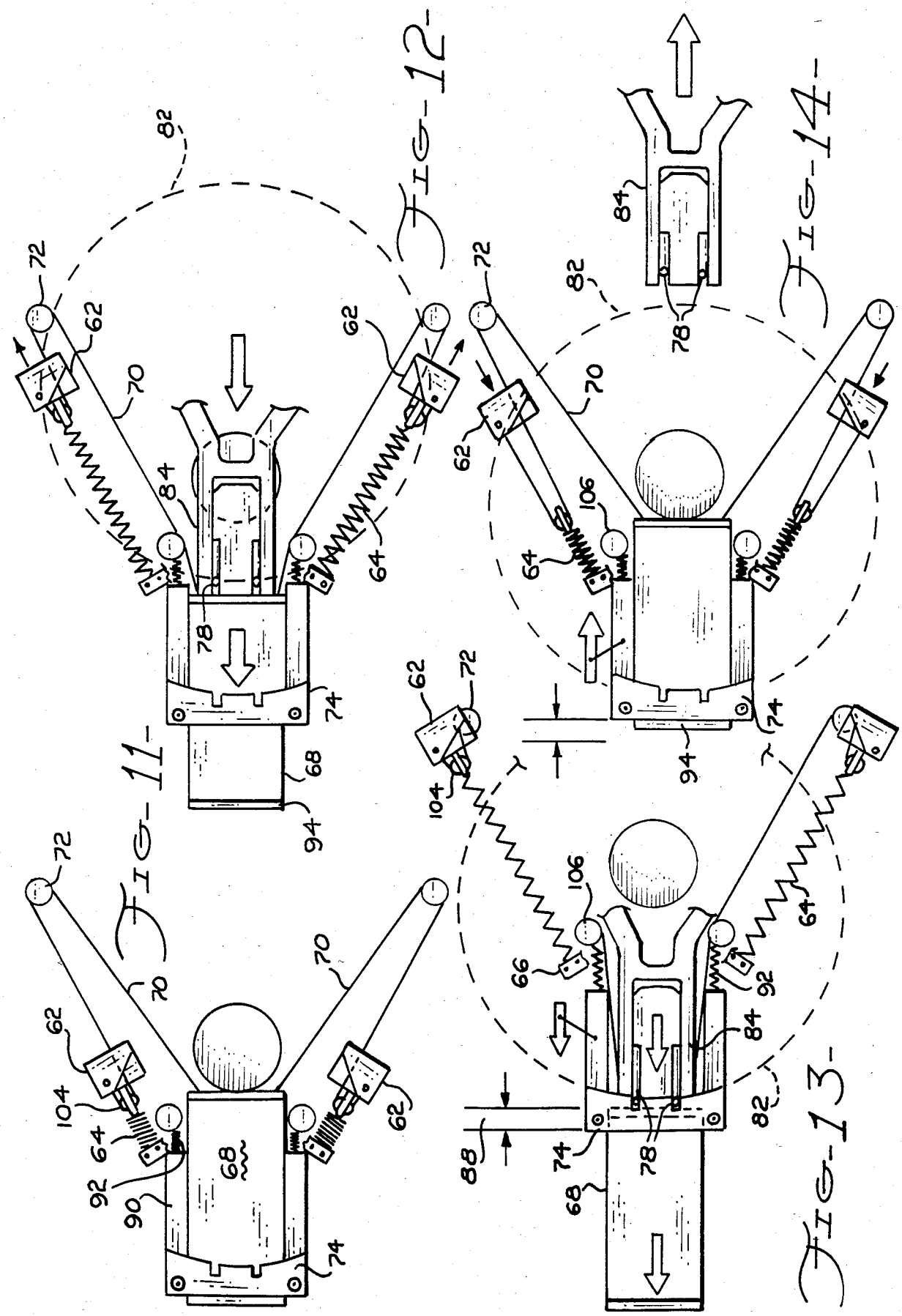

INTEGRATED CIRCUIT WAFER HANDLING SYSTEM

BRIEF DESCRIPTION OF THE INVENTION

This invention relates generally to mechanisms for the handling of delicate semiconductor wafers during their manufacturing process, and more particularly to a handling system for automatically transferring such wafers between a position at atmospheric pressure and a latched position on a specimen stage in a high vacuum chamber without appreciable loss of vacuum.

Semiconductor circuitry devices are manufactured by the photographic reduction and printing of the various circuit elements upon the surface of a thin disk or wafer of a material such as silicon. Many of such circuits are printed on the wafer and as many as a hundred or more of the circuits, each about a quarter of an inch square and each containing perhaps thousands of transistors and other circuit elements, may be printed through the photographically reduced mask upon each disk having a diameter of four or five inches. In such microcircuitry, the conductors interconnecting the various components must be extremely thin and closely spaced with conductor and spacing dimensions typically on the order of two microns. Continuing attempts toward further reduction will result in thinner conductors and even closer spacing.

The goals and results of circuit reduction are higher speed electronics, cost savings, and miniaturization of electronic systems employing the circuits. But circuit reduction also presents problems to the circuitry manufacturer. For example, breaks in the extremely thin conductors or short circuits between the narrowly spaced conductors and circuit elements can only be detected by powerful manually operated optical microscopes or by electron microscopes, the latter being more efficient because of higher magnification and much better resolution.

Electron microscopic inspection is performed in an evacuated specimen chamber of the microscope and the admission and removal of specimens from the microscope chamber necessarily results in the breaking of the vacuum and then repumping the vacuum chamber prior to the next inspection. Various mechanical handling devices have been developed for minimizing the handling of a semiconductor wafer during its introduction into the chamber, placement on the specimen stage, and subsequent removal from the chamber. Some of these devices employ complicated driving motions, such as pivoting extension and retraction, rotational devices, etc. that result in extremely complicated mechanical systems that may require the opening of large doors on the specimen chamber and the loss of all vacuum therein. The present wafer handling system overcomes the problems inherent in the prior art systems and automatically transfers a wafer through a very small door in the specimen chamber and into a latched position on the specimen chamber stage and, after the electron microscopic inspection is completed, the removal of the wafer through the chamber door without the complete loss of vacuum from the chamber so that it may be repumped to the required vacuum level in a minimum of time.

Briefly described, the invention includes a track mounted wafer holder and a microscope stage that is automatically adjustable to receive wafers of various diameters. The holder is initially in a sealable outer chamber and is moved by a chain that transports it through a small slot-like sealable door between the microscope specimen chamber and its outer chamber. A magnet on the transport chain is magnetically coupled to a second magnet located under the floor of the sealed outer chamber and moved by motor to linearaly move the wafer holder. The wafer holder includes a mechanism which, upon contacting the microscope specimen stage, releases the wafer to its position on the stage which has a novel means for firmly clamping wafers of various diameters. Upon contacting the stage a second time the wafer holer will pick up the wafer for its return from the specimen chamber through the slot-like sealable door to the outer chamber and subsequent removal from the inspection station. Thus, the only vacuum loss in the specimen chamber results from the admission of the small amount of air entering the sealable small outer chamber during the loading and removal of a wafer from the wafer holder.

BRIEF DESCRIPTION OF THE DRAWINGS

In the drawings which illustrate the preferred embodiment of the invention:

FIG. 3 is a sectional elevation view of the outer chamber and drive mechanism taken along the lines 3—3 of FIG. 1;

FIG. 4 is a sectional plan view taken along the lines 4—4 of FIG. 1 and illustrates the wafer holder in the sealable outer chamber and microscope specimen chamber wafer stage;

FIGS. 4A and 4B are perspective views illustrating two forms of wafer stops on the specimen chamber wafer stage;

FIG. 5 is a sectional side elevation view taken along the lines 5—5 of FIG. 3;

FIGS. 6 and 7 are plan views illustrating the operation of the specimen stage during the placement of the wafer on the stage;

FIG. 8 is an elevation view of the specimen stage taken along the lines 8—8 of FIG. 7;

FIG. 8A is a view of the section 8A of FIG. 8 showing in detail the wafer release mechanism at the end of the wafer holder;

FIG. 9 is an end elevation view taken along the lines 9—9 of FIG. 8;

FIG. 10 is a plan view illustrating the specimen stage after positioning the wafer thereon; and FIGS. 11 through 14 are plan views illustrating the specimen stage prior to wafer placement, during placement, during wafer locking on the stage, and after removal of the wafer holder.

DETAILED DESCRIPTION

Figure 1:
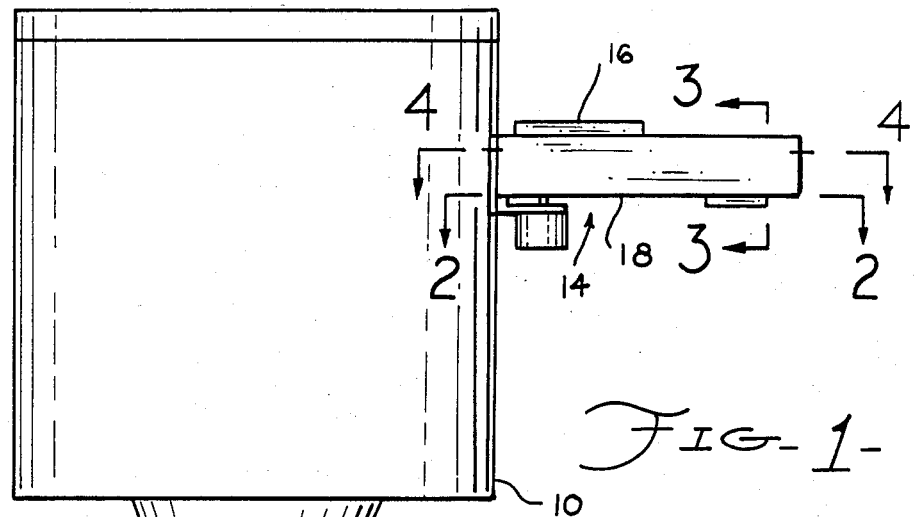
FIG. 1 is a general outline diagram of an electron microscope with a wafer transport mechanism mounted to the microscope specimen.

Schematically illustrated in FIG. 1 is an electronic microscope specimen chamber 10 having a vacuum pump 12 connected thereto. Not illustrated in FIG. 1 is the electron beam generator and the various lenses associated with an electron microscope and which are generally located above the specimen chamber illustrated.

Mounted on the side of the chamber 10 is the integrated circuit wafer handling system 14 which includes a hinged sealable top door 16 on the top surface of the handling system housing 18, and a drive motor 20 which operates to transfer the wafer carriage or holder within the housing 18 into and from a specimen stage within the chamber 10.

Figure 2:
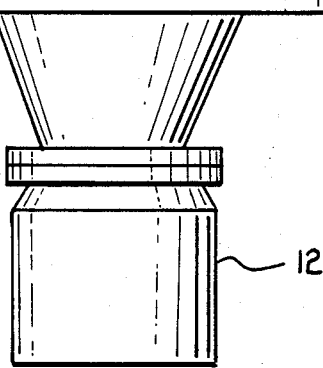
FIG. 2 is a schematic plan view of the transport mechanism taken along the lines 2—2 of FIG. 1.
Figure 2:
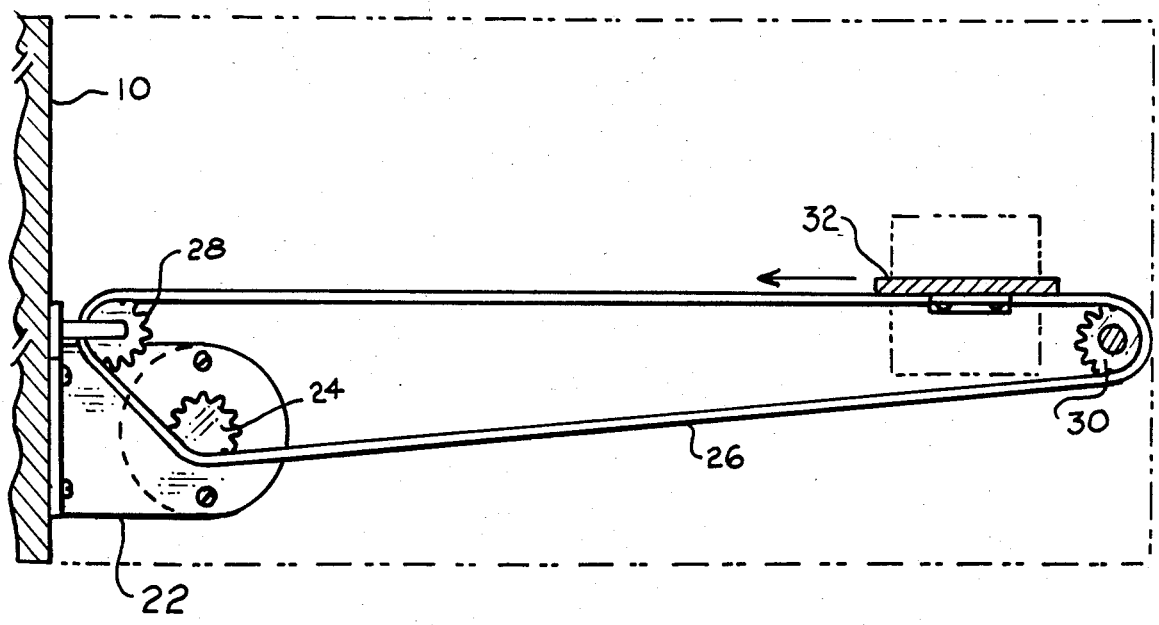

FIG. 2 is a schematic plan view taken along the lines 2—2 of FIG. 1 and illustrates the drive motor 20 mounted to an angle bracket 22 which is bolted to the exterior surface of the chamber 10. As shown in FIG. 2, a sprocket 24 on the motor shaft engages a looped or endless flexible drive chain 26 which is also supported by idler sprockets 28 and 30 that are rotatably mounted to the bottom of the floor of the housing 18 at positions that align the drive chain 26 substantially perpendicular to the exterior surface of the chamber 10. Attached at one point in the endless flexible chain 26 is a bracket 32 which carries a magnet that serves to move the wafer holder along a track into the specimen chamber 10, as will be subsequently described.

FIG. 3 is a sectional elevational end view of the wafer handling system taken along the lines 3—3 of FIG. 1 and illustrates the motor 20 for driving the chain 26, and the bracket 32 to which is attached a rectangular carriage 34. The carriage is mounted for linear movement along a line perpendicular to the outer surface of the specimen chamber 10 and is supported in linear bearings 36 in bearing grooves in the parallel outer side surfaces of the carriage, and in inner walls 38 formed below the floor of the housing 18. The entire length of the floor of the housing between its inner walls 38 includes a section 40 of non-ferrous material that is as thin as practical yet sufficiently strong to resist deflection or breakage when subjected to the pressure differences between atmospheric and those used in the specimen chamber.

As shown in FIG. 3, the motor and chain driven carriage 34 contains a magnet 42 having a planar top surface parallel with and minimally spaced from the lower surface of the thin floor section 40. Similarly spaced from, but above the thin section 40 is a second magnet 44 suitably polarized to be attracted to the exterior magnet 42 through the thin floor section 40. The second or interior magnet 44 is mounted in a carriage 46 mounted in bearings for linear movement parallel with the exterior carriage 34, as illustrated. It is to be noted that the interior carriage 46 is within the confines of the housing 18 and, because of the magnetic coupling between the motor driven exterior magnet 42 and the interior magnet 44, the interior carriage 46 will linearly move along its track to follow the linear movement of the motor driven exterior magnet.

As shown in the sectional plan view of FIG. 4 and elevational view of FIG. 5, the interior carriage 46 supports an integrated circuit wafer carrier 48. The carrier 48 is an elongated member having a generally triangular wafer supporting neck 50 positioned within the housing and having its apex adjacent the specimen chamber end of the housing when the carriages 46 and 34 are positioned in the outer or opposite end of the housing. As best shown in FIG. 4, the neck 50 of the carrier 48 extends toward and can pass through a sealable hinged gate 52 into the interior of the specimen chamber 10 and, as will be subsequently described, can place a circuit wafer into a locked position on a specimen stage 54 within the chamber.

FIG. 4 illustrates some of the details of the specimen stage 54 which will be later shown and explained in greater detail. Mounted on the stage 54 is a circular pedestal 56 having an approximate sixty degree open sector facing the wafer holder and symmetrical about the central axis of the holder. A central portion 58 in the bottom part of the open sector has a center hole and threaded screw holes for attaching the pedestal 56 to the specimen stage 54. Adjacent the edges of the open sector are rectangular slots 60 each carrying a slideable member 62 that extends toward the outer ends of the slots to engage the periphery of a wafer. Each member 62 is normally retained in a position near the center of the stage 54 by a spring 64 one end of which is connected between the member 62 and a small fixed bracket 66 at the inside end of the slot 60. Thus, the spring 64 operates to draw the slideable member 62 toward the center of the pedestal 56.

The top surface of the generally circular pedestal 56 contains a rectangular slot that extends from the apex of the open sector to the opposite periphery of the pedestal and along a line coaxial with the longitudinal axis of the wafer holder. Mounted within a dovetail track in this rectangular slot is a slideable rectangular block 68 the inner end of which is connected to thin cables 70 which are looped around small pulleys 72 adjacent the outer end of the sector slots 60 and back down through the slots to the outer ends of the wafer engaging slideable members 62. Thus, linear movement of the slideable rectangular block 68 in a direction away from the center of the pedestal 56 will draw the wafer engaging members 62 toward the outer ends of the slots 60 and against the retracting force of the springs 64.

FIGS. 4A and 4B illustrate two forms of wafer stops 74 that bridge the outer end of the rectangular slot and the slideable rectangular block 68 in that slot. The curved face of the stop of FIG. 4A is formed to engage the arcuate periphery of a circuit wafer and is bevelled down and inward as shown to capture the edge of the wafer. Similarly, the straight bevelled face of the stop of FIG. 4B may be used for wafers with various shaped edges and may be considered a universal stop. Each of the faces of the disc stops contain two small slots 76. As will be explained in detail in connection with FIG. 8 et seq., the slots 76 accomodate pins 78 in the end of the wafer carrier neck 50 which pins are extended upward by operation of a solenoid 80 in the wafer carrier and through the small slots 76 to engage a wafer edge for removal of that wafer from the specimen chamber.

FIG. 6 is another plan view of the wafer carrier 48 and specimen stage pedestal 56 illustrating the operation of the wafer carrier and wafer engaging members 62. The loader neck 50 of the wafer carrier supports a wafer 82, shown by the dashed lines in the drawing. The apex end of the loader neck 50 is formed to include a push block 84 which is a generally rectangular member adapted to contact the slideable rectangular block 68. Thus, when the wafer carrier 48 is moved inward in the direction shown by the arrow 86, the push block 84 forces the rectangular block 68 outward so that the attached cables 70 pull the wafer engaging members 62 radially outward and against the force exerted by the springs 64.

FIGS. 7 and 8 illustrate the operation of the wafer engaging members upon further movement of the loader neck 50 and its push block 84 against the inner end of the slideable block 68. As previously mentioned, the slideable block 68 is mounted in a dovetail groove in the surface of the the stage pedestal 56 as shown in detail in the end drawing of FIG. 9. The block 68 may therefore extend from the edge of the pedestal 56 by the small amount 88 shown in FIG. 7 to permit the leading edge of the wafer 82 to attain its position on the pedestal 56. The dovetail sleeve 90 therefore is slideable in the dovetail groove and the slideable block 68 is slideable within the dovetail sleeve. Small springs 92 connected between the inner end of the dovetail sleeve 90 and the bracket 66 urge the dovetail sleeve toward the center of the pedestal and an upward lip 94 at the outer end of the slideable rectangular block 68 also draws the dovetail sleeve back toward the pedestal center by operation of the longer springs 64.

During wafer loading operations, the lower surface of the wafer must pass above the engaging members 62 with sufficient clearance to prevent accidental contact and resulting scratching or damage to the thin delicate semiconductor material of the wafer. Therefore, the pedestal is tilted, as shown in FIG. 8, about a horizontal rotational axis normal to the longitudinal centerline axis of the wafer loader and approximately through the face of the disc stops 74 so that the wafer carrier 48 will place the leading edge of the wafer 82 in its proper position at the bevelled face of the disc stop 74. The mechanism for tilting the specimen stage and wafer pedestal, in the preferred embodiment, is computer controlled and forms no part of the invention. If desired, however, the pedestal tilting mechanism may be manually operated, or controlled by a suitable cam mounted to the wafer carrier 48 and cooperating with a tilt operating lever in the specimen chamber upon entering the chamber.

FIG. 8A illustrates in detail the operation of a solenoid operated wafer pick-up mechanism mounted to the wafer carrier 48 for releasing and picking up a wafer during its transfer between the pedestal 56 and the carrier. The mechanism includes a small wire clip 96 that is pivotable on a horizontal transverse axis under the surface of a cross member 97 at the apex of the loader neck 50. The clip includes outer end pieces that turned up to form the pins 78, mentioned in the description of FIG. 4, which hold and release the leading edge of a wafer. The clip is bent at the pivot point to form a short crank section 98 the end of which is connected to a spring 99 that biases the clip so that the pins 78 normally extend up to contact the wafer's leading edge. The end of the crank section is also connected by a thin wire 100 to the solenoid 80 mentioned in connection with FIG. 4.

When the wafer 82 is first loaded on the carrier in the housing 18, its leading arcuate edge is placed against the pins 78 of the pick-up mechanism, and when the wafer is in its proper position in the specimen pedestal the actuation of the solenoid 80, either by manual or computer controlled operation, will cause the pins 78 to drop to release the wafer. Similarly, when an empty wafer carrier is inserted into the mechanism of the pedestal, the pins 78, now recessed by the solenoid 80, are then extended by release of the solenoid to capture the wafer for its return from the specimen chamber.

FIG. 10 illustrates the operation of the pedestal mechanism upon the removal of the wafer loader 50 after depositing a wafer 82 on the specimen pedestal 56. As the loader 50 moves away in the direction indicated by the arrow 102 the push block 84 at the end of the loader releases its pressure against the slideable block 68 and the block 68 it drawn toward the direction shown by its arrow by the force of the springs 64 and the interconnecting cables 70. The springs 64 draw in the wafer engaging members 62 to the point at which they contact the edge of the wafer 82 to thereby secure the wafer between the three substantially equally spaced points of the disc stop 74 and the two engaging members 62. At this point it will be noted that each thin cable 70, after passing around the pulley 72, is passed through second pulleys 104 and then to the engaging members 62. The second pulleys are connected to the springs 64 which operate to fully withdraw the slideable rectangular block 68 after the engaging members 62 have contacted the wafer edge. The operation of the pulley system will be more readily understood after examination of FIGS. 11-14.

FIGS. 11 through 14 schematically illustrate the various steps in the operation of the specimen stage pedestal 56 without showing parts unnecessary for an understanding of that operation.

FIG. 11 illustrates the pedestal components in the normal or unemployed condition. Springs 64 are unextended and have forced inward the slideable wafer engaging members 62 and the small springs 92 have retracted the dovetailed sleeve 90 which carries the slideable rectangular block 68.

FIG. 12 shows a partial insertion of the wafer loader push block 84 into the pedestal mechanism and against the slideable block 68. Movement of the block in the direction shown by the arrows draws in the cables 70 to extend outward the wafer engaging members 62 against the biasing action of the springs 64. It will be noted that the arcuate leading edge of the wafer 82 is positioned against the pins 78 of the wafer pick-up clip 96 shown in FIG. 8A.

FIG. 13 illustrates the position of the various components upon full insertion of the wafer loader. At this point the end of the loader neck push block 84 has forced the slideable block 68 and its dovetail sleeve 90 to their fully extended position to thereby fully extend the wafer engaging block 62 to their outermost position. The leading edge of the wafer 82 is now captured by the bevelled face of the wafer stop 74 and the solenoid operated wafer clip pins 78 extending through the slots 76 in the disc stop are ready to be retracted by operation of the solenoid 80. It will be noted that the cable 70 from the wafer engaging blocks 62 not only extend around the pulleys 104 and 72, but also around additional pulleys 106 located adjacent the bracket 66 to prevent wear of the cable on the edges of the slot 60.

FIG. 14 illustrates the position of the various components after the deposition of the wafer 82 on the stage and the removal of the wafer carrier from the vacuum chamber in a direction indicated by the arrow. The springs 64 have drawn the wafer engaging members 62 into contact with the edge of the wafer which also is locked against the downward bevelled face of the wafer stop 74. The springs 64 have also drawn in the slideable rectangular block 68 to the point at which the upper lip 94 stops further inward movement of the block. When the wafer carrier has passed through the gate 52 between the vacuum chamber and outer chamber, the gate is tightly closed to seal the outer chamber from the vacuum chamber. The outer door 16 on the sealable outer chamber may then be opened if desired without loss of vacuum from within the vacuum chamber. Similarly, during loading operations, the outer door 16 or the outer chamber must be opened while the inner gate 52 is sealed to prevent loss of vacuum. Then the outer door 16 is closed and the wafer transport mechanism passes the wafer through the gate to the vacuum chamber with the only vacuum loss resulting from the small volume of atmospheric pressure air entering the large volume of the vacuum chamber. Thus a small pressure rise will occur in the vacuum chamber and can readily be pumped down to the required operating pressures.

We claim:

1. In combination with a vacuum chamber, a handling system for transfering wafer discs from a position at atmospheric pressure to and from the interior of the vacuum chamber with minimum loss of vacuum from said chamber, said handling system comprising:

a sealable gate through the side wall in the vacuum chamber, said gate having a width suitable to pass a disc therethrough;

a substantially rectangular sealable exterior chamber having a sealable top door, a first end of said exterior chamber being attached and sealed to the exterior side wall of said vacuum chamber and around the opening of said gate;

a moveable disc carrier horizontally mounted on tracks in the inner walls of said exterior chamber, said tracks being aligned parallel with an axis normal to said vacuum chamber side wall at said sealable gate, said carrier having a first end section adjacent said sealable gate for supporting a wafer disc, and supporting at its second end a first magnet positioned adjacent an enclosing interior surface of a thin floor of said exterior chamber, said disc carrier including a pair of disc engaging pins located at the lead end of said disc carrier, said pins being vertically moveable by a solenoid beneath the disc carrying surface for engaging and releasing the leading edge of a disc;

a motor driven endless drive means located outside of said exterior chamber and having a linear section parallel with said normal axis, the linear section of said drive means being coupled to a second magnet located adjacent the outer enclosing surface of said thin floor of said exterior chamber, said second magnet being magnetically coupled to said first magnet for linearly moving said disc carrier along its tracks in response to corresponding movement of said drive means; and a stage within said vacuum chamber for removing a wafer disc from the end section of said disc carrier, said stage having a disc stop with a disc contacting leading edge conforming to the shape of a disc and a pair of slots spaced to receive said pair of disc engaging pins, said stage having a pair of spaced disc engaging members moveable in slots radially extending outward at an angle from said disc stop toward said gate in response to forces exerted against a slideable member on said stage by the inward movement of the leading end of said disc carrier end section, said disc engaging member being spring biased for grasping two substantially equally spaced points on the disc periphery upon the withdrawal of said disc carrier leading end, said spring bias provided by a spring coupled between a first pulley and a stationary member on said stage, each of said engaging members being attached to a cable passing through said first pulley, a second pulley at the extreme outward end of said slot, and to the slideable member on said stage.

2. The disc handling system claimed in claim 1 wherein the volume of said sealable exterior chamber is small with respect to that of said vacuum chamber.

3. The disc handling system claimed in claim 1 wherein said stage is tiltable on its vertical axis in a direction toward said gate to enable the bottom surface of a disc on said disc carrier to clear said disc engaging members.

* * * * *